US007868459B2

(12) United States Patent
Audet et al.

(10) Patent No.: US 7,868,459 B2

(45) Date of Patent: Jan. 11, 2011

(54) SEMICONDUCTOR PACKAGE HAVING NON-ALIGNED ACTIVE VIAS

(75) Inventors: Jean Audet, Granby (CA); Luc Guerin, Granby (CA); David L. Questad, Hopewell Junction, NY (US); David J. Russell, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 1007 days.

(21) Appl. No.: 11/469,950

(22) Filed: Sep. 5, 2006

(65) Prior Publication Data

US 2008/0054482 A1 Mar. 6, 2008

(51) Int. Cl.
*H01L 23/48* (2006.01)

(52) U.S. Cl. ....................... 257/774; 257/776; 257/781; 257/E23.062; 438/629; 438/637

(58) Field of Classification Search ................ 257/774, 257/776, 781, E23.062, E23.007; 438/629, 438/637, 639, 640, 667, 668, 672

See application file for complete search history.

(56) References Cited

U.S. PATENT DOCUMENTS

| | | | | |
|---|---|---|---|---|
| 6,313,537 | B1 * | 11/2001 | Lee et al. | 257/758 |
| 6,542,352 | B1 * | 4/2003 | Devoe et al. | 361/321.2 |
| 6,900,395 | B2 | 5/2005 | Jozwiak et al. | |
| 2001/0010407 | A1 * | 8/2001 | Ker et al. | 257/781 |

* cited by examiner

*Primary Examiner*—Thinh T Nguyen

(74) *Attorney, Agent, or Firm*—Wenjie Li; Hoffman Warnick LLC

(57) ABSTRACT

A semiconductor package is disclosed including a first capture pad isolated from an adjacent second capture pad by an insulator; a first plurality of electrically active vias connecting the first capture pad to the second capture pad; a third capture pad isolated from the second capture pad by an insulator; and a second plurality of electrically active vias connecting the second capture pad to the third capture pad. Each via of the first plurality of active vias is non-aligned with each via of the second plurality of active vias. The structure provides reduction of strain on the vias when a shear force is applied to a ball grid array used therewith while minimizing the degradation of the electrical signals.

7 Claims, 2 Drawing Sheets

SEMICONDUCTOR PACKAGE HAVING NON-ALIGNED ACTIVE VIAS

BACKGROUND OF THE INVENTION

1. Technical Field

The invention relates generally to semiconductor packaging, and more particularly, to a semiconductor package including non-aligned active vias in adjacent layers.

2. Background Art

Advances in flip chip plastic ball grid array (FCPBGA) laminate technology continue to push the state of the art for electrical performance and reliability. For new applications containing high speed signal (HSS) lines, it is critical for signal integrity to have the signal lines isolated from power and ground planes. This is easily designed into HSS lines routing the signal through the FCPBGA laminate structure. However, to provide electrical connections to a card or board, these lines must end in a ball grid array (BGA) joint. This situation often requires routing the line down through power or ground planes.

When a HSS line is routed through a power or ground plane, there needs to be a clearance, or a gap, between the signal and power or ground to protect signal integrity. In the case of the connection to a BGA, this clearance feature means that the microvia connecting the BGA pad to the next layer needs to provide the mechanical robustness to ensure that the BGA balls do not sever during normal handling for assembly and test. Where the BGA pad is connected to the second or third layer away, this can be accomplished by a stacked via structure, which increases the risk of an electrical open due to mechanical damage.

The use of multiple vias to connect a BGA pad to a power or ground plane is common and known in the art. Typical connections utilize 2-5 microvias per BGA pad to connect to the power or ground plane, which is typically the next layer up from the BGA pad. However, the purpose of having multiple vias is to reduce the electrical current flowing through a single via by providing multiple parallel paths for the current. The mechanical robustness of a BGA ball connected to a power or ground plane has not been a concern.

HSS connections are more susceptible to mechanical damage than power and ground connections. It is therefore desirable to provide more mechanical robustness to HSS BGA via connections. One approach to this problem is to increase the via land diameter or provide metal layers as reinforcement, thus making the HSS BGA via stacks more closely resemble the power and ground structures. While this approach has advantages, there are limitations due to the electrical isolation requirements from the surrounding power and ground features.

SUMMARY OF THE INVENTION

A semiconductor package is disclosed including a first capture pad isolated from an adjacent second capture pad by an insulator; a first plurality of electrically active vias connecting the first capture pad to the second capture pad; a third capture pad isolated from the second capture pad by an insulator; and a second plurality of electrically active vias connecting the second capture pad to the third capture pad. Each via of the first plurality of active vias is non-aligned with each via of the second plurality of active vias. The structure provides reduction of strain on the vias when a shear force is applied to a ball grid array used therewith while minimizing the degradation of the electrical signals.

A first aspect of the invention provides a semiconductor package comprising: a first capture pad adjacent to and isolated from a second capture pad by an insulator; a first plurality of electrically active vias connecting the first capture pad to the second capture pad; a third capture pad adjacent to and isolated from the second capture pad by an insulator; and a second plurality of electrically active vias connecting the second capture pad to the third capture pad, wherein each via of the first plurality of active vias is non-aligned with each via of the second plurality of active vias.

A second aspect of the invention provides a semiconductor package comprising: a first capture pad adjacent to and isolated from a second capture pad by an insulator; a first set of three electrically active vias arranged in a substantially triangular configuration and connecting the first capture pad to the second capture pad; a third capture pad adjacent to and isolated from the second capture pad by an insulator; and a second set of three electrically active vias arranged in a substantially triangular configuration and connecting the second capture pad to the third capture pad, wherein the second set of electrically active vias are positioned rotated with respect to the first set of electrically active vias.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
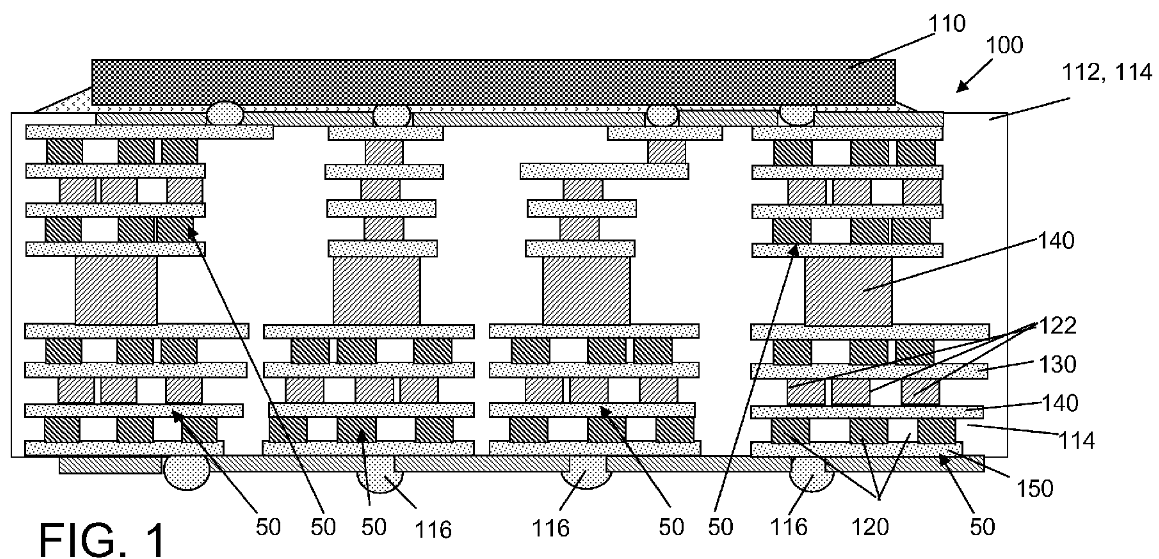
FIG. 1 shows a cross-sectional side view of a semiconductor package according to one embodiment of the invention.

Referring to the drawings, FIG. 1 shows a cross-sectional side view of a semiconductor package 100 according to one embodiment of the invention. Semiconductor package 100 may include any number of via stack structures 50, which provide a path for electrical current between a chip 110 and balls 116 of a ball grid array (BGA) of the package. The BGA may couple to another layer (e.g., a computer mother board (not shown)). Each of via stack structures 50 includes a number of capture pads 130, 140, 150 within body 112. Each capture pad 130, 140, 150 may include any conductive material now known or later developed for use in semiconductor packaging, e.g., copper, aluminum, etc. Body 112 may include an insulator 114, for example, an organic material or a plastic material. Insulator 114 separates each capture pad 130, 140, 150.

A first capture pad 130 is adjacent to and isolated from a second capture pad 140 by insulator 114. A first plurality (set) of electrically active vias 122 connect first capture pad 130 to second capture pad 140, i.e., through insulator 114. "Electrically active," as used herein, means that vias are operative vias, i.e., not dummy vias. A third capture pad 150 is adjacent to and isolated from second capture pad 140 by insulator 114. A second plurality (set) of electrically active vias 120 connect second capture pad 140 to third capture pad 150. Each via of first plurality of active vias 120 is non-aligned with each via of second plurality of active vias 122. That is, each via of one set is not directly aligned with any via of the other set. Vias 120 and 122 are electrically coupled via capture pads 130, 140, 150. In one embodiment, vias 120 are signal vias that carry a signal from/to chip 110. In the case where a via stack 50 is used to carry a signal, capture pads 130, 140, 150 are preferably dimensioned to a minimal size so as to accept the multiple vias 120, 122 only. Alternatively, vias 120, 122 may be power/ground vias. In that case, capture pads 130, 140, 150 may not have a definite dimension, i.e., they may use a large portion of the package surface. This arrangement is well known in the art and is called a power or ground plane structure.

It is understood that FIG. 1 represents a simplified rendition of a semiconductor package 100 in that the teachings of the invention may be repeated numerous times throughout semiconductor package 100. It is also understood that while the embodiment shown in FIG. 1 shows numerous layers arranged as described above coupled to an identical arrangement thereabove by one or more larger via(s) 140, an arrangement of capture pads 130, 140, 150 and vias 120, 122 may be applied to a prior art aligned via stack (shown in the middle of FIG. 1). Furthermore, it is understood that semiconductor package 100 may include similar via stacks 50 repeated numerous times therein so that any number of terminals within chip 110 or BGA pad can be coupled together. In addition, while one embodiment including three vias in each plurality of vias has been illustrated, other structures may include two, four, five or more vias arranged at the appropriate spacing allowed by the size of BGA 116 and connected lands.

Figure 2:
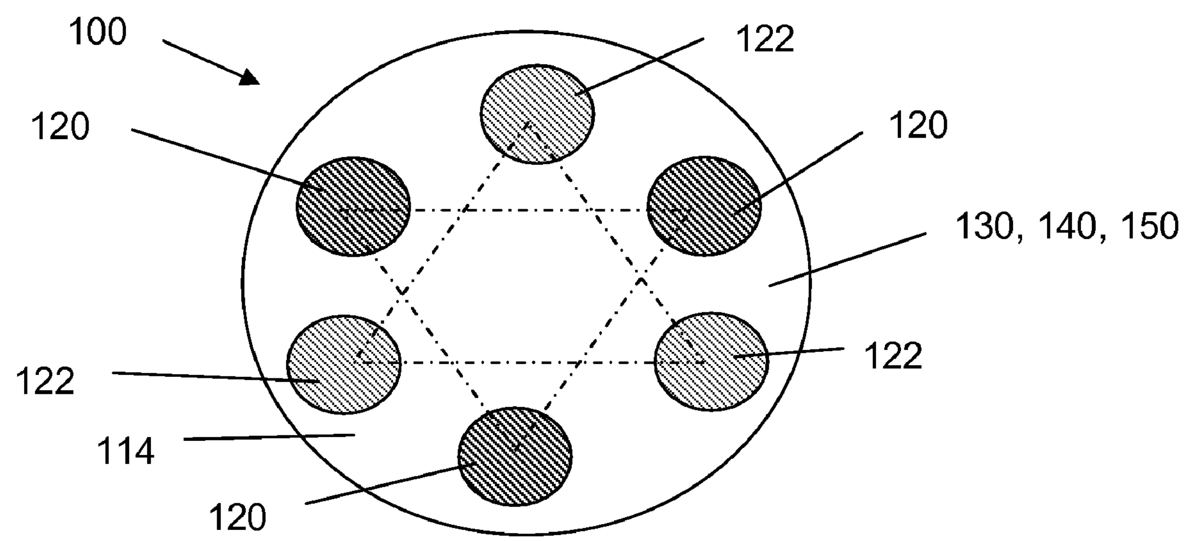
FIG. 2 shows a top view of multiple layers of a semiconductor package according to one embodiment of the invention.

FIG. 2 shows a top view of multiple layers of a semiconductor package 100 according to one embodiment of the invention. In this embodiment, each plurality of vias 120, 122 includes three vias arranged in a substantially triangular configuration (shown in phantom). In this case, second plurality of electrically active vias 122 is positioned rotated with respect to first plurality of electrically active vias 120 so as to have non-aligned vias. In this particular example, the substantially triangular configuration of first plurality of electrically active vias 120 is rotated approximately 60 degrees relative to the substantially triangular configuration of second plurality of electrically active vias 122. As a result, vias of adjacent layers do not overlap at all. It is understood, however, that other angular rotations, e.g., approximately 90, 120, 180 degrees, may also be possible within the scope of the invention. In addition, some overlap between vias of adjacent layers may be allowed.

Although the multiple vias 120, 122 per layer include more conductive material per connection and result in a potentially stiffer structure, the thermal cycle induced strain increases only minimally. Accordingly, the benefit of redundant connections is realized without a significant increase in via strain. Multiple via connections have not previously been used for high speed signal (HSS) ball grid array (BGA) via stack connections due to a minor degradation in the electrical signal integrity. However, the use of multiple vias connections provides a significant improvement in mechanical robustness when a shear force is applied to the BGA. The advantage in mechanical integrity outweighs the minor impact to the electrical integrity.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A semiconductor package comprising:

a first capture pad adjacent to and isolated from a second capture pad by an insulator;

a first plurality of electrically active vias connecting the first capture pad to the second capture pad;

a third capture pad adjacent to and isolated from the second capture pad by an insulator; and a second plurality of electrically active vias connecting the second capture pad to the third capture pad, wherein the second plurality of electrically active vias are positioned rotated with respect to the first plurality of electrically active vias, wherein each via of the first plurality of active vias is not directly aligned with each via of the second plurality of active vias, and each plurality of electrically active vias includes three vias arranged in a substantially triangular configuration.

2. The semiconductor package of claim 1, wherein each insulator includes one of an organic material and a plastic material.

3. The semiconductor package of claim 1, wherein the first plurality of electrically active vias and the second plurality of electrically active vias include signal vias.

4. The semiconductor package of claim 1, wherein the substantially triangular configuration of the first plurality of electrically active vias is rotated approximately 60 degrees relative to the substantially triangular configuration of the second plurality of electrically active vias.

5. A semiconductor package comprising:

a first capture pad adjacent to and isolated from a second capture pad by an insulator;

a first set of three electrically active vias arranged in a substantially triangular configuration and connecting the first capture pad to the second capture pad;

a third capture pad adjacent to and isolated from the second capture pad by an insulator; and a second set of three electrically active vias arranged in a substantially triangular configuration and connecting the second capture pad to the third capture pad, wherein the second set of electrically active vias are positioned rotated with respect to the first set of electrically active vias.

6. The semiconductor package of claim 5, wherein the first set of three electrically active vias and the second set of three electrically active vias include signal vias.

7. The semiconductor package of claim 5, wherein the substantially triangular configuration of the first set of three electrically active vias is rotated approximately 60 degrees relative to the substantially triangular configuration of the second set of three electrically active vias.

* * * * *